US008456945B2

(12) United States Patent
Gold et al.

(10) Patent No.: US 8,456,945 B2
(45) Date of Patent: Jun. 4, 2013

(54) 10T SRAM FOR GRAPHICS PROCESSING

(75) Inventors: Spencer Gold, Pepperell, MA (US); Stephen V. Kosonocky, Fort Collins, CO (US); Samuel Naffziger, Fort Collins, CO (US)

(73) Assignee: Advanced Micro Devices, Inc., Austin, TX (US)

( * ) Notice: Subject to any disclaimer, the term of this patent is extended or adjusted under 35 U.S.C. 154(b) by 509 days.

(21) Appl. No.: 12/766,403

(22) Filed: Apr. 23, 2010

(65) Prior Publication Data

US 2011/0261064 A1    Oct. 27, 2011

(51) Int. Cl.
*G11C 8/00* (2006.01)

(52) U.S. Cl.
USPC .............. 365/230.05; 365/185.02; 365/211

(58) Field of Classification Search
USPC ........................... 365/230.05, 211, 185.02
See application file for complete search history.

(56) References Cited

U.S. PATENT DOCUMENTS

| | | | |
|---|---|---|---|
| 7,349,266 B2 * | 3/2008 | Ramaraju et al. | 365/189.05 |
| 7,545,702 B2 * | 6/2009 | Kenkare et al. | 365/230.06 |
| 8,045,363 B2 * | 10/2011 | Kim | 365/148 |
| 8,120,937 B2 * | 2/2012 | Ji et al. | 365/49.17 |
| 2002/0003743 A1 | 1/2002 | Kunikiyo | |
| 2007/0274140 A1 | 11/2007 | Joshi et al. | |
| 2007/0279965 A1 | 12/2007 | Nakazato et al. | |
| 2010/0214862 A1 * | 8/2010 | Kim et al. | 365/226 |
| 2011/0153959 A1 * | 6/2011 | Chu et al. | 711/149 |

FOREIGN PATENT DOCUMENTS

| | | |
|---|---|---|
| DE | 101 33 281 A1 | 1/2002 |
| EP | 1 204 121 A2 | 5/2002 |

OTHER PUBLICATIONS

International PCT/US2011/032033 Search Report dated Jun. 6, 2011.
Written Opinion dated Jun. 6, 2011.
Okumura et al., "A 0.56-V 128kb 10T SRAM Using Column Line Assist (CLA) Scheme," Advanced Micro Devices, 10th International Symposium on Quality Electronic Design 2009 pp. 659-663.
Noguchi et al., "A 10T Non-Precharge Two-Port SRAM for 74% Power Reduction in Video Processing," IEEE Computer Society Annual Symposium on VLS 2007.

(Continued)

*Primary Examiner* — Pho M Luu
(74) *Attorney, Agent, or Firm* — Williams, Morgan & Amerson, P.C.

(57) ABSTRACT

A method, apparatus, computer chip, circuit board, computer and system are provided in which data is stored in a low-voltage, maskable memory. Also provided is a computer readable storage device encoded with data for adapting a manufacturing facility to create an apparatus. The method includes storing a data value in a memory cell in a storage device if a first access parameter associated with the memory cell matches a first pre-determined value and if a second access parameter associated with the memory cell matches a second pre-determined value. The method also includes maintaining a data value in the memory cell in the storage device if the first access parameter differs from the first pre-determined value. The apparatus includes a first and second pair of access parameter ports operatively coupled together and associated with a first and second access parameter respectively. The first and second pair of access parameter ports may be adapted to allow access through the first and second pair of access parameter ports if the first access parameter matches a first pre-determined value, and if the second access parameter matches a second pre-determined value.

38 Claims, 8 Drawing Sheets

OTHER PUBLICATIONS

Chang et al., "Stable SRAM Cell Design for the 32nn Node and Beyond," 2005 Symposium on VLSI Technology Digest of Technical Papers pp. 128 and 129.

Kim et al., "A High-Density Subthreshold SRAM with Data-Independent Bitline Leakage and Virtual Ground Replica Scheme," 2007 IEEE International Solid-State Circuits Conference pp. 330-331 and 606.

Chang et al., "A 32 kb 10T Sub-Threshhold SRAM Array with Bit-Interleaving and Differential Read Scheme in 90 nm CMOS," IEEE Journal of Solid-State Circuits, vol. 44, No. 2 Feb. 2009 pp. 650-658.

Greene et al., "High Performance 32nm SOI CMOS with High-k/Metal Gate and 0.149 $\mu m^2$ SRAM and Ultra Low-k Back End with Eleven Levels of Copper," 2009 Symposium on VLSI Technology Digest of Technical Papers, pp. 140-141.

Calhoun et al., "A 256kb Sub-threshhold SRAM in 65 nm CMOS," 2006 IEEE International Solid-State Circuits Conference Feb. 8, 2006.

Bhavnagarwala et al., "The Impact of Intrinsic Device Fluctuations on CMOS SRAM Cell Stability," IEEE Journal of Solid-State Circuits, vol., 36, No. 4, Apr. 2001.

* cited by examiner 810　bit # 31..................................16 15.................................0
Data Word 'A': 1111 1111 1111 1111 0000 0000 0000 0000

FIGURE 8A

820　bit # 31..................................16 15.................................0
Data Mask 'A': 0111 1111 1111 1111 1111 1111 1111 1110

FIGURE 8B

830　bit # 31..................................16 15.................................0
Data Word 'B': 0000 0000 0000 0000 1111 1111 1111 1111

FIGURE 8C

840　bit # 31..................................16 15.................................0
Data Word 'C': 1000 0000 0000 0000 1111 1111 1111 1110

FIGURE 8D

10T SRAM FOR GRAPHICS PROCESSING

BACKGROUND

1. Field of the Invention

Embodiments of this invention relate generally to computers, and, more particularly, to a method, system and apparatus for a low-voltage, maskable graphics processing memory.

2. Description of Related Art

General purpose computing systems, such as personal computers, have evolved from relatively simple display tasks to complex tasks that involve high resolution images and multimedia offerings. Systems that require complex, processor intensive graphics capabilities also have higher voltage requirements, and thus higher power requirements. As computer systems become more complex and user applications increase in system resource usage, there is an increased need for memory that consumes less power for graphics processing.

Typically, modern memory implementations for graphics processing have involved cell configurations, such as 6T and 8T cells. Such memories often consist of an array of "cells," also called "bitcells," each comprised of metal oxide semiconductor field effect transistors (MOSFETs). Memories constructed from these cells and bitcells have several drawbacks. For example, masking a cell to avoid writing data to the cell is a common task in graphics memories; however, it, is complex and voltage/power intensive in 6T and 8T cells. Lines used to write data in current 6T and 8T write-maskable cells must be pre-charged at the beginning of each data cycle, and then driven again later in the cycle. Driving lines twice per cycle is costly in terms of power consumption and line control complexity. Additionally, the pre-charging phase is time consuming and requires the memory to operate at a slower overall frequency.

Previous configurations of 10T cells also have drawbacks that make them unsuitable for use in graphics memory. For example, previous 10T cells, as well as 6T and 8T cells, utilize a single write enable line, and thus a single pair of pass transistors. If bit masking is desired in the case of a single pass transistor pair implementation, the pass transistors needs to be sized for both read and write operations. However, pass transistors are typically sized small for read operations and sized large for write operations. Because only a single pair of pass transistors is used, the transistors' size cannot be optimized for both read and write operations, nor can the size be optimized for either a read or a write operation because both operations must be performed. Thus, the optimal size must be compromised. In other words, the single pass transistor pair model cannot be sized to the optimal area for a read (smaller) or sized to the optimal area for writes (larger); rather the single pair pass transistor model must have transistors sized in between the optimal read and write sizes. This non-optimization decreases voltage/power efficiency.

Previous configurations of 10T cells that do not require a pre-charge operation suffer from other drawbacks as well. In particular, these types of 10T cells lack the ability to mask bits during write operations. Other existing 10T cells may provide for the ability to mask bits, but at a cost of increased voltage. Such 10T cell configurations require write bitlines that are differential, which leads to sizing issues with pass transistors (MOSFETs) similar to the issues seen with single write enable (i.e., single pass transistor) configurations. In other words, the pass transistors coupled to the differential write bitlines cannot be sized to the optimum area for both reads and writes. The transistors must be sized down to accommodate read stability in addition to being large enough to allow writeability. This non-optimization decreases voltage/power efficiency because the memory cell is less writeable at lower voltages. Any decrease in operating voltage in these 10T cells is gained at the cost of a slower operational frequency.

SUMMARY OF EMBODIMENTS OF THE INVENTION

In one aspect of the present invention, a method is provided. The method includes storing a data value in a memory cell in a storage device if a first access parameter associated with the memory cell matches a first pre-determined value and if a second access parameter associated with the memory cell matches a second pre-determined value. The method also includes maintaining a data value in the memory cell in the storage device if the first access parameter differs from the first pre-determined value.

In another aspect of the invention, an apparatus is provided. The apparatus includes first and second pairs of access parameter ports, operatively coupled together and associated with a first and second access parameter respectively. The first and second pairs of access parameter ports are adapted to allow access through the access parameter port pairs if the first access parameter matches a first pre-determined value and if the second access parameter matches a second pre-determined value.

In yet another aspect of the invention, a system is provided. The system includes at least one control logic block. The at least one control logic block is adapted to set one or more first access parameters and adapted to set one or more second access parameters. The system also includes a plurality of data storage devices operatively coupled to the control logic block(s). The plurality of data storage devices are capable of receiving the first access parameter(s) and the second access parameter(s) from the control logic block(s). Within the system, the each storage devices comprises a first pair of storage components adapted to provide a pull-up function to store a first logical data value in the storage device and a second pair of storage components coupled to the first pair of storage components, where the second pair of storage components are adapted to provide a pull-down function to store a second logical data value in the storage device. The first and second pairs of storage components are further adapted to maintain a value in the data storage structure. Each of the storage devices in the system also include a pair of first access ports and a pair of second access ports coupled to the first and second pair of storage components. The first and second pair of access ports are adapted to allow the storage device to store a data value if a first access parameter and a second access parameter each match a predetermined value. The first and second access ports are further adapted to prevent storage of a data value if the first access parameter differs from a first predetermined value.

In yet another aspect of the invention, a computer chip is provided. The computer chip includes a plurality of data storage devices and at least one control block operatively coupled to the plurality of data storage devices. The at least one control block is adapted to control the plurality of data storage devices. One or more first access parameters and one or more second access parameters are provided to the plurality of data storage devices by the control block. Each of the plurality of data storage devices includes a first pair of access parameter ports associated with a respective first access parameter and a second pair of access parameter ports associated with a respective second access parameter. Each of the plurality of data storage devices also includes a data storage structure coupled to the first pair of access parameter ports and to the second pair of access parameter ports. The data storage structure is adapted to store a data value if the respective first access parameter is provided on the first pair of access parameter ports, and if a respective second access parameter is provided on the second pair of access parameter ports, where the respective first access parameter matches a first pre-determined value, and where the respective second access parameter matches a second pre-determined value. The data storage structure is further adapted to maintain a stored value if the respective first access parameter provided on the first pair of access parameter ports differs from the first pre-determined value.

In yet another aspect of the invention, a circuit board is provided. The circuit board includes a graphics processing unit and a random access memory operatively coupled to the graphics processing unit. The random access memory includes control logic circuitry, a plurality of storage units and a plurality of storage arrays operatively coupled to the control logic circuitry. the plurality of storage arrays includes the plurality of storage units. Each of the plurality of storage units includes a first pair of access parameter ports associated with a first access parameter and a second pair of access parameter ports associated with a second access parameter. Each of the plurality of storage units also includes a data storage structure coupled to the first pair of access parameter ports and to the second pair of access parameter ports. The data storage structure is adapted to store a data value if the first access parameter is provided on the first pair of access parameter ports, and if a second access parameter is provided on the second pair of access parameter ports where the first access parameter matches a first pre-determined value and the second access parameter matches a second pre-determined value. The storage structure is further adapted to maintain a stored value if the first access parameter provided on the first pair of access parameter ports differs from the first pre-determined value.

In yet another aspect of the invention, a computer is provided. The computer includes a printed circuit board comprising a bus, a central processing unit operatively coupled to the bus, and a graphics processor operatively coupled to the bus. The computer also includes a first memory device operatively coupled to the graphics processor. The first memory device includes a first pair of access parameter ports associated with a first access parameter and a second pair of access parameter ports associated with a second access parameter. The first memory device also includes a data storage structure coupled to the first pair of access parameter ports and to the second pair of access parameter ports. The data storage structure is adapted to store a data value if the first access parameter is provided on the first pair of access parameter ports, and if the second access parameter is provided on the second pair of access parameter ports, where the first access parameter matches a first pre-determined value, and wherein the second access parameter matches a second pre-determined value. The data storage structure is further adapted to maintain a stored value if the first access parameter provided on the first pair of access parameter ports differs from the first pre-determined value.

In yet another aspect of the invention, a computer readable storage device encoded with data that, when implemented in a manufacturing facility, adapts the manufacturing facility to create an apparatus is provided. The created apparatus comprises a first pair of access parameter ports associated with a first access parameter and a second pair of access parameter ports associated with a second access parameter. The first pair of access parameter ports are operatively coupled to the second pair of access parameter ports. The first pair of access parameter ports and the second pair of access parameter ports are adapted to allow access through the access parameter port pairs if the first access parameter matches a first pre-determined value and if the second access parameter matches a second pre-determined value

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIG. 8 illustrates a diagram depicting one embodiment of a data masking operation.

Figure 1:
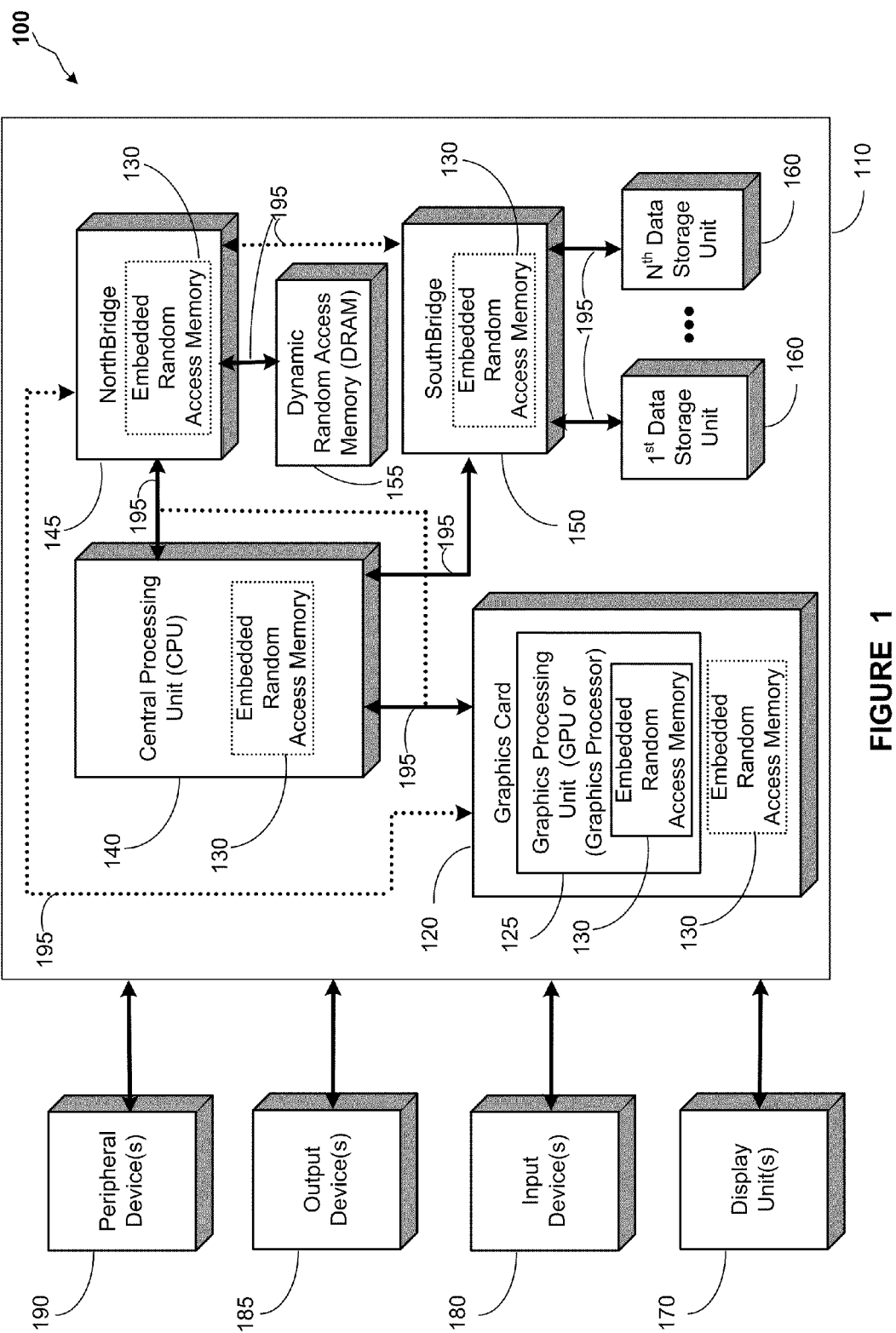
FIG. 1 schematically illustrates a simplified block diagram of a computer system including a graphics card that employs a storage scheme according to one embodiment.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions may be made to achieve the developers' specific goals, such as compliance with system-related and business-related constraints, which may vary from one implementation to another. Moreover, it will be appreciated that such a development effort might be complex and time-consuming, but may nevertheless be a routine undertaking for those of ordinary skill in the art having the benefit of this disclosure.

The present invention will now be described with reference to the attached figures. Various structures, connections, systems and devices are schematically depicted in the drawings for purposes of explanation only and so as to not obscure the disclosed subject matter with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments of the present invention generally provide for data storage scheme using a 10T memory cell to provide a low-voltage, maskable memory structure that may be embedded in different computing and processing devices.

Turning now to FIG. 1, a block diagram of an exemplary computer system 100, in accordance with an embodiment of the present invention, is illustrated. In various embodiments the computer system 100 may be a personal computer, a laptop computer, a handheld computer, a mobile device, a telephone, a personal data assistant (PDA), a server, a mainframe, a work terminal, or the like. The computer system includes a main structure 110 which may be a computer motherboard, circuit board or printed circuit board, a desktop computer enclosure and/or tower, a laptop computer base, a server enclosure, part of a mobile device, personal data assistant (PDA), or the like. In one embodiment, the main structure 110 includes a graphics card 120. In one embodiment, the graphics card 120 may be an ATI Radeon™ graphics card from Advanced Micro Devices ("AMD") or any other graphics card using memory, in alternate embodiments. The graphics card 120 may, in different embodiments, be connected on a Peripheral Component Interconnect (PCI) Bus (not shown), PCI-Express Bus (not shown) an Accelerated Graphics Port (AGP) Bus (also not shown), or any other connection known in the art. It should be noted that embodiments of the present invention are not limited by the connectivity of the graphics card 120 to the main computer structure 110. In one embodiment, computer runs an operating system such as Linux, Unix, Windows, Mac OS, or the like.

In one embodiment, the graphics card 120 may contain a graphics processing unit (GPU) 125 used in processing graphics data. The GPU 125, in one embodiment, may include an embedded memory 130. In one embodiment, the embedded memory 130 may be an embedded random access memory (RAM), an embedded static random access memory (SRAM), or an embedded dynamic random access memory (DRAM). In alternate embodiments, the embedded memory 130 may be embedded in the graphics card 120 in addition to, or instead of, being embedded in the GPU 125. In various embodiments the graphics card 120 may be referred to as a circuit board or a printed circuit board or a daughter card or the like.

In one embodiment, the computer system 100 includes a central processing unit (CPU) 140, which is connected to a northbridge 145. The CPU 140 and northbridge 145 may be housed on the motherboard (not shown) or some other structure of the computer system 100. It is contemplated that in certain embodiments, the graphics card 120 may be coupled to the CPU 140 via the northbridge 145 or some other connection as is known in the art. For example, CPU 140, northbridge 145, GPU 125 may be included in a single package or as part of a single die or "chips". Alternative embodiments which alter the arrangement of various components illustrated as forming part of main structure 110 are also contemplated. The CPU 140 and/or the northbridge 145, in certain embodiments, may each include an embedded memory 130 in addition to other embedded memories 130 found elsewhere in the computer system 100. In certain embodiments, the northbridge 145 may be coupled to a system RAM (or DRAM) 155; in other embodiments, the system RAM 155 may be coupled directly to the CPU 140. The system RAM 155 may be of any RAM type known in the art; the type of RAM 155 does not limit the embodiments of the present invention. In one embodiment, the northbridge 145 may be connected to a southbridge 150. In other embodiments, the northbridge 145 and southbridge 150 may be on the same chip in the computer system 100, or the northbridge 145 and southbridge 150 may be on different chips. In one embodiment, the southbridge 150 may have an embedded memory 130, in addition to any other embedded memories 130 elsewhere in the computer system 100. In various embodiments, the southbridge 150 may be connected to one or more data storage units 160. The data storage units 160 may be hard drives, solid state drives, magnetic tape, or any other writable media used for storing data. In various embodiments, the central processing unit 140, northbridge 145, southbridge 150, graphics processing unit 125, DRAM 155 and/or embedded RAM 130 may be a computer chip or a silicon-based computer chip, or may be part of a computer chip or a silicon-based computer chip. In one or more embodiments, the various components of the computer system 100 may be operatively, electrically and/or physically connected or linked with a bus 195 or more than one bus 195.

In different embodiments, the computer system 100 may be connected to one or more display units 170, input devices 180, output devices 185 and/or other peripheral devices 190. It is contemplated that in various embodiments, these elements may be internal or external to the computer system 100, and may be wired or wirelessly connected, without affecting the scope of the embodiments of the present invention. The display units 170 may be internal or external monitors, television screens, handheld device displays, and the like. The input devices 180 may be any one of a keyboard, mouse, track-ball, stylus, mouse pad, mouse button, joystick, scanner or the like. The output devices 185 may be any one of a monitor, printer, plotter, copier or other output device. The peripheral devices 190 may be any other device which can be coupled to a computer: a CD/DVD drive capable of reading and/or writing to physical digital media, a USB device, Zip Drive, external floppy drive, external hard drive, phone and/or broadband modem, router/gateway, access point and/or the like. To the extent certain exemplary aspects of the computer system 100 are not described herein, such exemplary aspects may or may not be included in various embodiments without limiting the spirit and scope of the embodiments of the present invention as would be understood by one of skill in the art.

Figure 2:
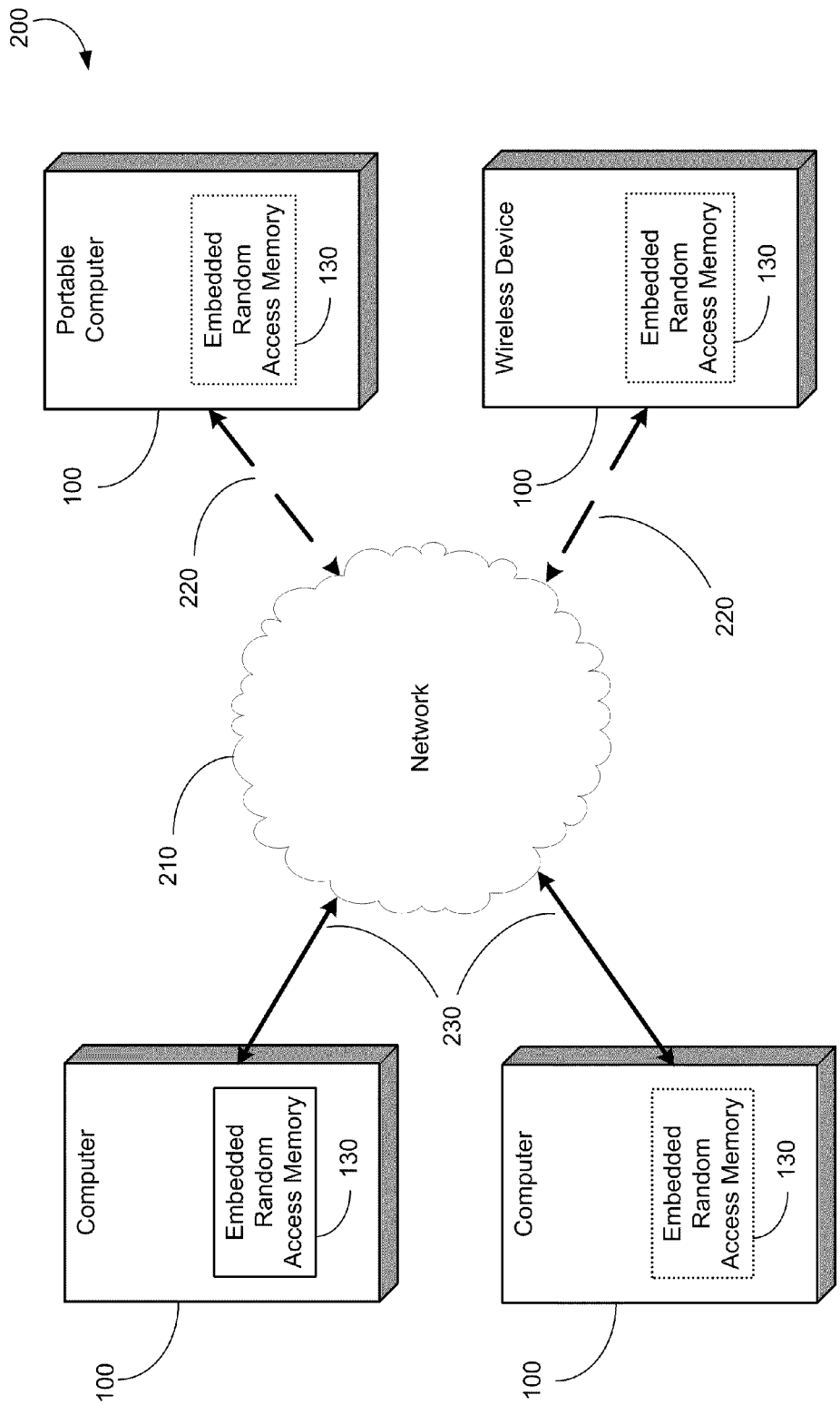
FIG. 2 shows a simplified block diagram of a multiple computer system connected via a network according to one embodiment.

Turning now to FIG. 2, a block diagram of an exemplary computer network 200, in accordance with an embodiment of the present invention, is illustrated. In one embodiment, any number of computer systems 100 may be communicatively coupled and/or connected to each other through a network infrastructure 210. In various embodiments, such connections may be wired 230 or wireless 220 without limiting the scope of the embodiments described herein. The network 200 may be a local area network (LAN), wide area network (WAN), personal network, company intranet or company network, the Internet, or the like. In one embodiment, the computer systems 100 connected to the network 200 via network infrastructure 210 may be a personal computer, a laptop computer, a handheld computer, a mobile device, a telephone, a personal data assistant (PDA), a server, a mainframe, a work terminal, or the like. The number of computers depicted in FIG. 2 is exemplary in nature; in practice any number of computer systems 100 maybe coupled/connected using the network 200.

Figure 3:
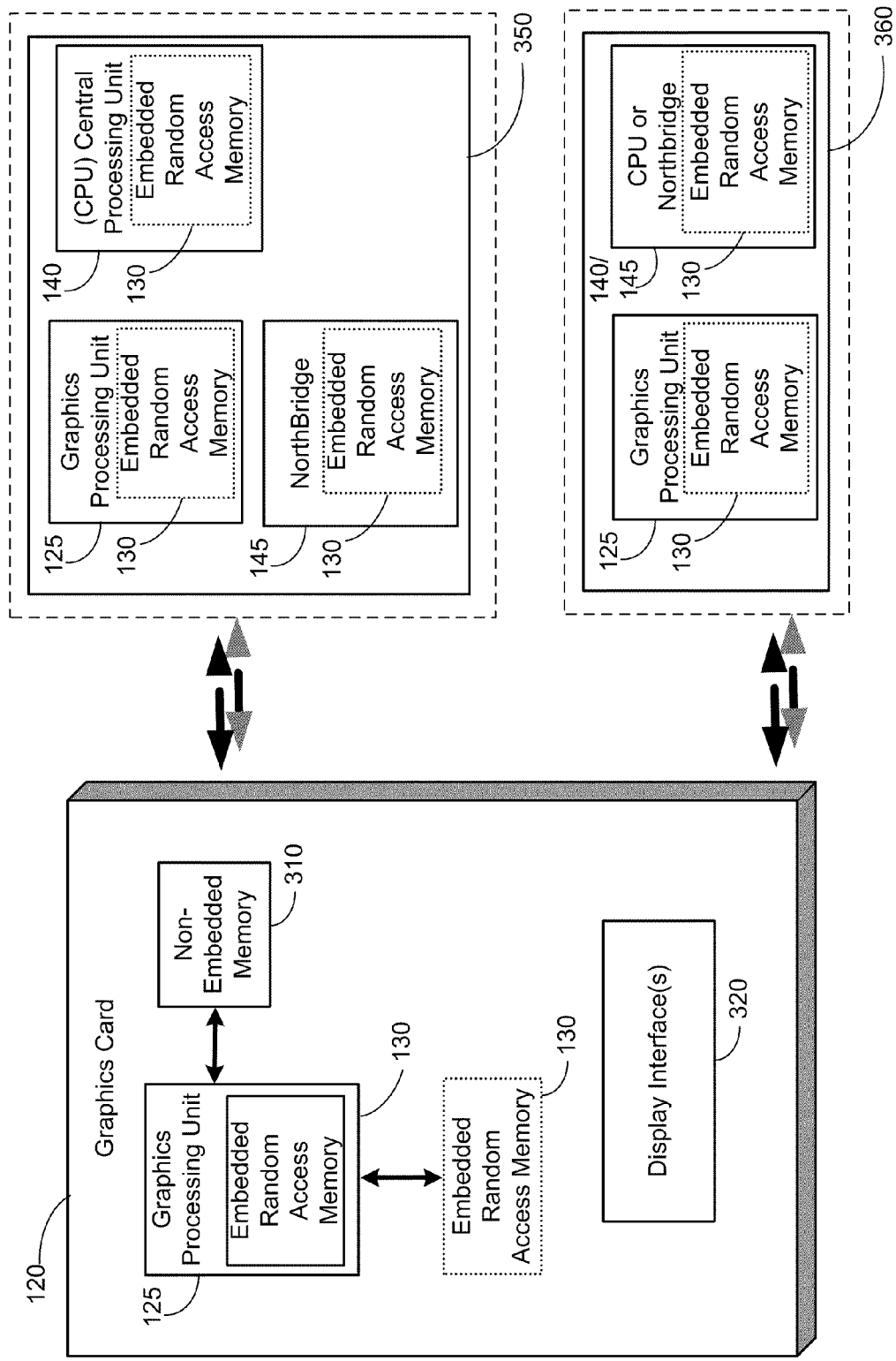
FIG. 3 provides a more detailed representation of one embodiment of the graphics card provided in FIG. 1.

Turning now to FIG. 3, a block diagram of an exemplary graphics card 120, in accordance with an embodiment of the present invention, is illustrated. In one embodiment, the graphics card 120 may contain a graphics processing unit (GPU) 125 used in processing graphics data. The GPU 125, in one embodiment as shown, may include an embedded memory 130. In one embodiment, the embedded memory 130 may be an embedded static random access memory (SRAM). In alternate embodiments, the embedded memory 130 may be embedded in the graphics card 120 in addition to, or instead of, being embedded in the GPU 125. In another embodiment, the graphics card 120 may include a non-embedded memory 310, for example a dynamic RAM (DRAM) in addition to any embedded memories 130. The graphics card 120 may also include one or more display interfaces 320. To the extent certain exemplary aspects of the graphics card 120 are not described herein, such exemplary aspects may or may not be included in various embodiments without limiting the spirit and scope of the embodiments of the present invention as would be understood by one of skill in the art.

Referring still to FIG. 3, in one embodiment, the graphics processing unit 125 and embedded memory 130 may reside on the same silicon chip 350 as the CPU 140 and northbridge 145. In one alternate embodiment, the graphics processing unit 125 and embedded memory 130 may reside on the same silicon chip 360 as the CPU 140. In such embodiments, the silicon chip(s) 350/360 may be used in a computer system 100 in place of, or in addition to, the graphics card 120. The silicon chip(s) 350/360 may be housed on the motherboard (not shown) or other structure of the computer system 100.

Figure 4:
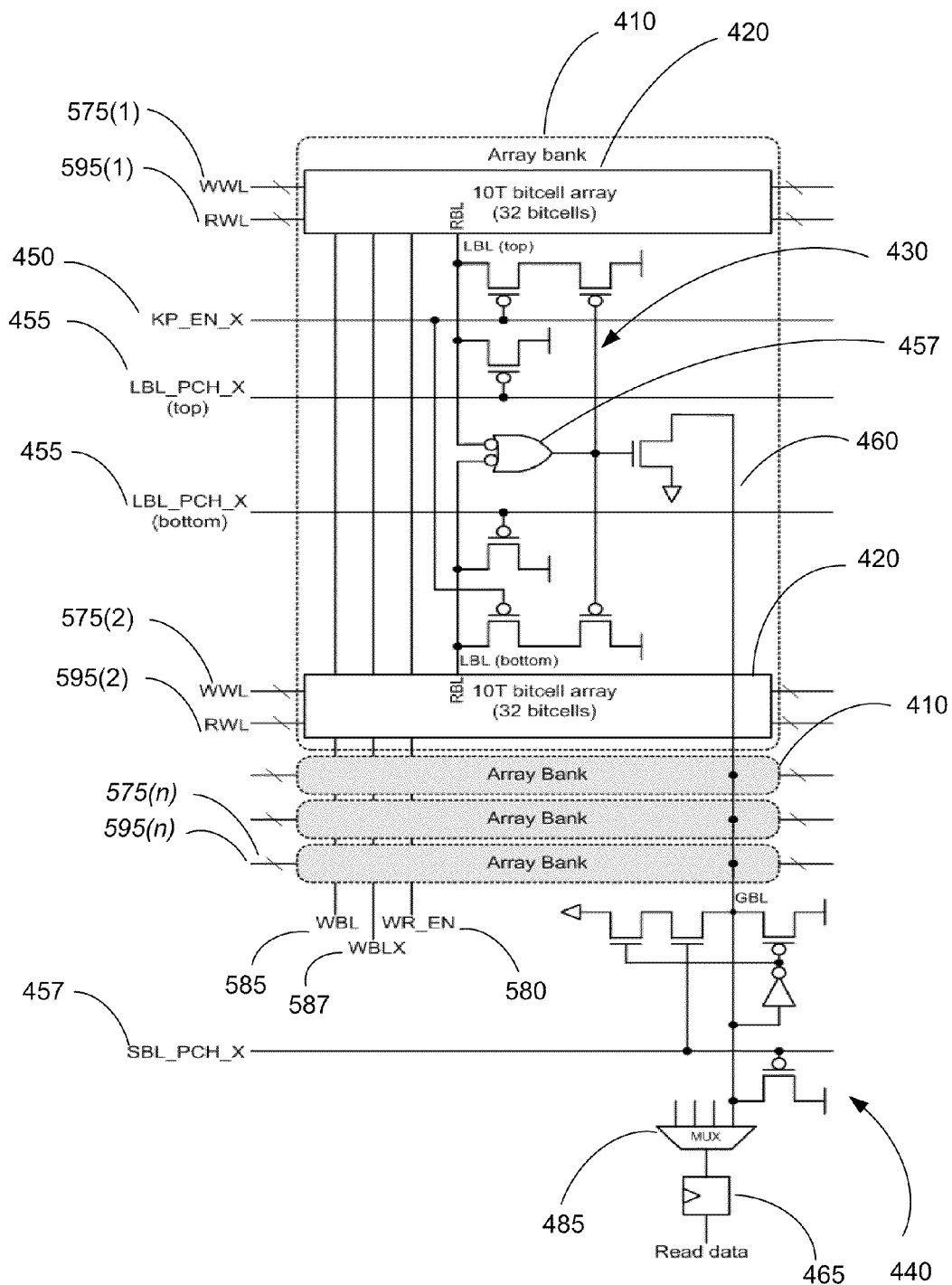
FIG. 4 illustrates an exemplary detailed representation of an embedded memory that is provided in FIGS. 1-3 according to one embodiment.

Turning now to FIG. 4, a diagram of an exemplary implementation of the embedded memory 130 is illustrated. The embedded memory 130 may contain a single, or a plurality of array banks 410. The array banks 410 may include single, or multiple, 10T bitcell arrays 420. In the illustrated exemplary embodiment, each 10T bitcell array 420 may contain thirty-two 10T bitcells (10T bitcell memory) 500, described in further detail with respect to FIG. 5; however, those skilled in the art will appreciate that additional or fewer 10T bit cells 500 may be employed without departing from the spirit and scope of the instant invention. For example, rows of eight, sixteen, thirty-two and/or sixty-four 10T bit cells 500 may be used. The 10T bitcells 500 within the 10T bitcell arrays 420 may be arranged into rows and/or columns with respect to a 10T bitcell array 420. The 10T bitcells 500 may also be arranged into rows and/or columns with respect to array banks 410. For example, in one embodiment, each 10T bitcell array 420 may be arranged as a single row of 32 bitcells 500 (i.e., 32 columns of individual 10T bitcells 500), and the array bank 410 may be arranged into one or more rows of 10T bitcell array(s) 420. This configuration may also be described in terms of 10T bitcells as an array of 32 columns of bitcells arranged in one or more rows (i.e., one or more bitcell arrays). For the purposes of description in one embodiment, a "word" may be comprised of 32 bits, but such a definition is not exclusive and may be different as understood by a person of skill in the art.

The array banks 410 may be controlled by one or more groups/blocks of control logic 430/440 for performing read line and write line enables, read bit and write bit enables, differential pair control, and the like, using control lines/signals. In other words, such groups of control logic 430/440 may coordinate various control signals which drive access parameters such as read wordline and write wordline enables as well as read bit and write bit enables. The one or more groups of control logic 430/440 may be part of a memory controller (not shown), or in other embodiments, may be separate from a memory controller itself but still used in performing memory reads and writes. While not all functions of the control logic groups 430/440 are described here, it would be apparent to one of ordinary skill in the art, having the benefit of this disclosure, that other functions may be performed by the control logic groups 430/440 and any accompanying connection logic.

For example, control logic group 430 may include other control signals carrying access parameters such as the keeper enable signal line (KP_EN_X) 450, the local bitline precharge controls (LBL_PCH_X) 455, as well as the NAND gate 457 and accompanying transistors, in addition to other logic and control signals or access parameters not shown. The keeper enable signal line 450 may be a tunable, self-timed keeper signal. The local bitline precharge controls 455 may, in one embodiment, support full-swing bitlines capable of or adapted to control 32 bitcells per bitline 455. These control logic group 430 components may be used to drive a global bitline (GBL) 460 for use in outputting read data from one or more array banks 410. The GBL 460 may, in one embodiment, be connected to or through the control logic group 440, which may contain a flip-flop or latch 465 and accompanying logical elements (e.g., transistors, multiplexors (465), inverters, and the like) for outputting the read data. The control logic group 440 may also connect to a system bitline channel control 457. The system bitline channel control 457 may serve as a system-wide control enable signal for the read data output.

Figure 5:
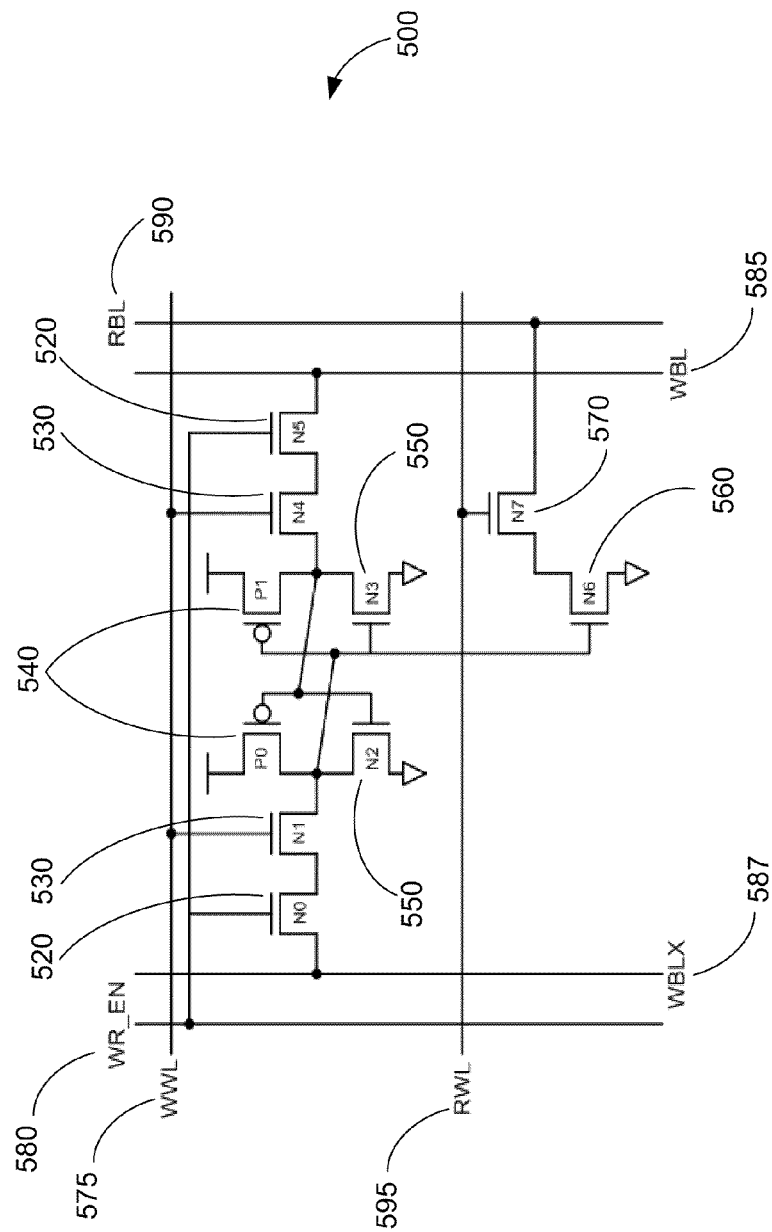
FIG. 5 illustrates a transistor-level diagram of a memory cell according to one exemplary embodiment.

Turning now to FIG. 5, a diagram of a 10T memory bitcell 500, in accordance with one embodiment of the present invention, is illustrated. The 10T memory bitcell 500 may include different configurations of transistors operatively, physically and/or electrically coupled together in different ways to provide low-voltage, maskable memory functions. It should be noted that not all elements associated with various embodiments of the 10T memory bitcell 500 are included in the drawings to avoid confusion and allow clarity of description of the figures. However, a person of ordinary skill in the art, with the benefit of this disclosure, would recognize that various resistors and pull-up/pull-down elements, capacitors, inductors, diodes, inverters, power and ground nodes, and the like, could be included in various embodiments without departing from the spirit and scope of the claimed invention. A 10T bitcell 500 may, in some embodiments, be referred to as a storage device, a data storage device and/or a memory.

FIG. 5, in accordance with one embodiment of the present invention, shows a configuration of a memory cell that is a 10T bitcell 500 composed of ten transistors. The 10T bitcell 500 depicted in FIG. 5, has various signaling components and signal lines (e.g., conductive traces, conductive conduits on a substrate, and the like) in addition to hardware components such as the transistors (e.g., MOSFETS in n-channel and/or p-channel configurations). While particular embodiments may be implemented exclusively in hardware, it is contemplated that other embodiments may be implemented in software, firmware and/or any combination of hardware, software and firmware. Likewise, fabrication and manufacturing techniques for making and/or utilizing 10T bitcells 500 may be accomplished with various combinations of hardware, software and firmware (not shown).

The 10T bitcell 500 depicted in FIG. 5, in accordance with one embodiment, includes hardware components where the name "Nx," where x is an integer, depicts n-channel MOSFETs, and the name "Px," where x is an integer, depicts p-channel MOSFETs. In different embodiments, the 10T bitcell 500, as depicted in FIG. 5, may include: transistors N0 and N5 520, transistors N1 and N4 530, transistors N2 and N3 550, transistor N6 560 and transistor N7 570. The 10T bitcell depicted in FIG. 5 also includes transistors P0 and P1 540. In one embodiment, the transistors N0 and N5 520 may be configured as the outer pass transistors; these transistors may, in one embodiment, be referred to as a first pair of access parameter ports or a first pair of access ports. The transistors N0 and N5 520 may be connected in series to the inner pass transistors N1 and N4 530, respectively; the N1 and N4 530 transistors may, in one embodiment, be referred to as a second pair of access parameter ports or a second pair of access ports. The source of the transistor N0 520 may be connected to the drain of the transistor N1 530 and the source of the transistor N5 520 may be connected to the drain of the transistor N4 530. In alternate embodiments, inner pass transistors N1 and N4 may be configured as the outer pass transistors; likewise, the outer pass transistors N0 and N5 may be configured as the inner pass transistors. (Similarly, the connections of the control signals carrying the access parameters write wordline 575 and write enable 580, as described below in more detail, may be swapped.) The inner pass transistors N1 and N4 530 may be connected to the transistors P0 540 and N2 550, and to the transistors P1 540 and N3 550, respectively. As shown in FIG. 5, according to one embodiment, the source of the transistor N1 530 may be connected to the drain of the transistor P0 540 and to the drain of the transistor N2 550; the source of the transistor N4 530 may be connected to the drain of the transistor P1 540 and to the drain of the transistor N3 550. As such, the drain of the transistors P0 and P1 540 may be connected in series to the drains of the transistors N2 and N3 550 respectively. As shown in FIG. 5, according to one embodiment, the sources of the transistors N2 and N3 550 may be connected to a reference voltage (e.g., ground, a design specific voltage, or the like) and the sources of the transistors P0 and P1 540 may be connected to a different reference voltage (e.g., an operating voltage Vcc, or the like).

In one alternative embodiment, the transistors N0, N1, N4, N5, N6 and N7 may be implemented as p-channel MOSFETs instead of n-channel MOSFETs. P-channel pass transistors would still be activated by access parameters write wordline 575 and write enable 580, in accordance with one or more embodiments. In one embodiment, a p-channel MOSFET used in place of transistor N6 may be connected to a reference voltage (e.g., an operating voltage Vcc, or the like).

In an alternative embodiment, the transistors P0 and P1 540 may be replaced with a comparable resistor-inverter combination and accompanying physical/electrical connections. Such a substitution may allow for greater manufacturing efficiency and reduced complexity by allowing processing of a single type of MOSFET (mixing p-channel and n-channel MOSFETs requires more manufacturing/fabrication steps than having all transistors be of one type or the other). Additionally, as shown in FIG. 5 according to one or more embodiments, the gates of the transistors P0 540 and N2 550 may each be connected to the drain of the transistor P1 550 and to the drain of the transistor N3 540, while the gates of the transistors P1 540 and N3 550 may each be connected to the drain of the transistor P0 540 and to the drain of the transistor N2 550.

In accordance with one embodiment, the transistors N6 560 and N7 570 may be connected together in series, where the drain of the transistor N6 560 may be connected to the source of the transistor N7 570. The source of the transistor N6 560 may be connected to a reference voltage (e.g., ground, a design specific voltage, or the like), and the gate of the transistor N6 560 may be connected to the gates of the transistors N3 550 and P1 540. This configuration allows the read data of the 10T bitcell 500 to be '0' (or "pulled low") if the gate of the transistor N6 560 is activated because the transistor 560 will act as a "closed circuit" providing a path to ground through the transistor N6 560. This configuration also allows the read data of the 10T bitcell 500 to be '1' (or "left high") if the gate of the transistor N6 560 is not activated because the transistor 560 will act as an "open circuit," preventing a path to ground through the transistor N6 560. It should be noted that while not shown, components for a "pull up" circuit (e.g., a resistor leading to a voltage potential) connected to the drain of the transistor N6 560 may be contemplated in various embodiments, but are not shown to avoid confusion in the figure. The drain of the transistor N7 570 may be operatively, physically and/or electrically connected to a read bitline (RBL) 590 (described in further detail below); such a connection provides a structure sufficient, in one or more embodiments, for making the transistor N7 570 capable of providing read data onto the read bitline 590.

In one embodiment, the transistors P0 and P1 540, N2 and N3 550, N6 560 and N7 570 may be referred to as part of a data storage structure. In one embodiment, the data storage structure may be part of a 10T bitcell 500. In one embodiment, the transistors P0 and P1 540 may be referred to as a first pair of storage components adapted to provide a pull-up function to store a first data value, and the transistors N2 and N3 550 may be referred to as a second pair of storage components adapted to provide a pull-down function to store a second data value. In one embodiment, the transistors N6 560 and N7 570 may be referred to as a third pair of storage components adapted to provide access to the a value stored in the data storage structure.

Referring still to FIG. 5, the 10T bitcell 500 as depicted, in accordance with one or more embodiments, includes access parameters driven on control signals and/or signal lines: a write word line (WWL) 575, a write enable (WR_EN) 580, a differential pair of write bitline (WBL) 585 and write bitline X (WBLX) 587, a read bitline (RBL) 590 and a read wordline (RWL) 595. In one embodiment, the write enable (WR_EN) 580 line may provide a first access parameter, and the write word line (WWL) 575 line may provide a second access parameter. In one embodiment, the read wordline (RWL) 595 line may provide a third access parameter.

In one embodiment, the write enable 580 may be connected to the gates of the outer pass transistors N0 and N5 520. The write enable 580 may be used to control a column or a portion of a column of the outer pass transistors N0 and N5 520 across multiple rows of 10T bitcell block(s) 500. The write wordline 575 may be connected to the gates of the inner pass transistors N1 and N4 530. The write wordline 575 may be used to control some or all of the inner pass transistors N1 and N4 530 in the 10T bitcell array 420. In one embodiment, separate write wordlines (575(1), 575(2) . . . 575(n)) may be used for each 10T bitcell array 420, although it is contemplated that the same writeline may be used for multiple 10T bitcell arrays 420 in alternate embodiments. As a result of the "in series" connection between the outer pass transistors 520 and inner pass transistors 530, data cannot be written to the 10T bitcell 500 unless both the write enable 580 and the write wordline 575 are asserted and the outer pass transistors 520 and inner pass transistors 530 are activated. Additionally, even if the write wordline 575 is asserted, data may not be written to the 10T bitcell 500 if the write enable 580 is not asserted. In this way, the embedded memory 130 has bit-maskable capabilities for write operations. Likewise, if write enable 580 is asserted but write wordline 575 is not asserted, no data will be written to the 10T bitcell 500. If no data is written to the 10T bitcell 500 during a memory cycle, the bitcell 500 retains its previous, existing data.

Referring still to FIG. 5, in one or more embodiments, the differential write bitline pair WBL 585 and WBLX 587 may be used to write data to the 10T bitcell 500 (described in further detail below). The differential write bitline pair 585, 587 may be connected to the drains of the transistors N5 520 and N0 520 respectively. It is contemplated that, in various embodiments, alternate configurations and/or connections for the differential write bitline pair 585, 587 are possible. For example, in one alternate embodiment, differential write bitline pair 585, 587 may be connected to the drains of the transistors N0 520 and N5 520 respectively. In such an alternate embodiment, the gate of the transistor N6 560 (described in further detail below) may be connected to the gates of the transistors P0 540 and N2 550.

The differential write bitline pair 585, 587 may be used to write to a column, or a portion of a column of the 10T bitcells 500 across multiple rows of 10T bitcell arrays 420 in one or more array bank(s) 410. That is, the differential write bitline pair 585, 587 may be used to write to some or all of the 10T bitcells 500 in a column of an embedded memory 130 structure. In one embodiment, the differential write bitline pair 585, 587 are statically driven, or driven once per memory cycle. In one or more embodiments, the differential write bitline pair 585, 587 are driven directly into the 10T bitcell 500 (see FIG. 5), the 10T bitcell array(s) 420 (see FIG. 4) and/or the array bank(s) 410 (see FIG. 4).

In one or more embodiments, the differential write bitline pair 585, 587 are adapted to and/or capable of driving entire or partial columns of the 10T bitcells 500 in the 10T bitcell array(s) 420 (see FIG. 4) and/or the array bank(s) 410 (see FIG. 4). In one embodiment, the differential write bitline pair 585, 587 writes to a given one of the 10T bitcells 500 when the write enable 580 and the write wordline 575 are both enabled (i.e., when the gates of the outer pass transistors N0 and N5 520 as well as the inner pass transistors N1 and N4 530 are activated). In one embodiment, even if the write wordline 575 is asserted, data may not be written to the 10T bitcell 500 on the differential write bitline pair 585, 587 if the write enable 580 is not asserted. In this way, as described above, the embedded memory 130 has bit-maskable capabilities for write operations. Likewise, if the write enable 580 is asserted but the write wordline 575 is not asserted, no data will be written to the 10T bitcell 500. If no data is written to the 10T bitcell 500 during a memory cycle, the bitcell 500 retains its previous, existing data.

Referring still to FIG. 5, the read bitline 590 and the read wordline 595 as depicted may be used to read data from the 10T bitcell 500 in various embodiments. The read bitline 590 may be connected to the drain of the transistor N7 570. In different embodiments, the read bitline 590 may be connected to an entire column of the 10T bitcells 500 in an array bank 410 (see FIG. 4), to a single one of the 10T bitcells 500 in one of the 10T bitcell arrays 420 (see FIG. 4), to a single, stand alone 10T bitcell 500 (see FIG. 5), or some other number of 10T bitcells 500 in various configurations (not shown). In one embodiment, read data may be sent on read bitline 590 by the transistor N7 570. The transistor N7 570 may put read data on the read bitline 590 when the gate of the transistor N7 570 is activated by the read wordline 595.

Those skilled in the art will appreciate that the read bitline 590 may also be implemented as a differential pair read bitline in one or more embodiments. For example, in the context of FIG. 5, a pair of n-channel transistors (N8 and N9, not shown), complementary to transistor pair N6 560 and N7 570, could be used. A transistor N8 (not shown) could be connected to the gate of transistor N2 550 in a fashion similar to how the transistor N6 560 is connected to the gate of transistor N3 550, and a transistor N8 (not shown) could be connected to the reference voltage and a transistor N9 (not shown) in a fashion similar to how the transistor N6 560 is connected to the reference voltage and the transistor N7 570. Similarly, a transistor N9 (not shown) could be connected to a differential read bitline RBLX (not shown) in a fashion similar to how the transistor N7 570 is connected to read bitline RBL 590. A transistor N9 (not shown) could also be connected to read wordline 595 and a transistor N8 (not shown) in a fashion similar to how the transistor N7 570 is connected to the transistor N6 560 and to read wordline 595.

According to one embodiment, the read wordline 595 may be used to control readability of a word of data, or a portion of a word of data (i.e., up to 32 bits of data in the exemplary embodiment). In one embodiment with thirty-two of the 10T bitcells 500 in each of the 10T bitcell arrays 420, this may be accomplished by connecting the read wordline 595 to the gate of each of the transistors N7 570 across the entire 32 bitcell row, or a portion of the row, of the 10T bitcell array(s) 420. Put another way, the read wordline 595 in various embodiments, may control the readability of all thirty-two 10T bitcells 500, or some portion thereof, in each of the 10T bitcell arrays 420.

It should be noted that an individual one of the 10T bitcells 500 (shown in FIG. 5) may exist independently of other ones of the 10T bitcells 500, and may store values on its own and apart from any other arrays and/or configurations of the 10T bitcells 500. A person of skill in the art having the benefit of this disclosure would realize that the scalability of a RAM and/or memory structure may vary from a single one of the 10T bitcells 500 (shown in FIG. 5) to a complex RAM structure (e.g., an SRAM structure) comprised of multiple ones of the array banks 410 (shown in FIG. 4), or any configuration in between or beyond. It is also contemplated that the connections described herein may be made directly or be made with intervening components (not shown). Likewise, described connections may be physical and/or electrical. It is further contemplated that other alternate embodiments and configurations would be apparent to one of ordinary skill in the art, having the benefit of this disclosure, and such configurations would not depart from the spirit and scope of the invention.

Referring still to FIG. 5, the sizing of the pass transistors N0/N5 520 and N1/N4 530 may allow for a memory structure that is maskable and able to function at higher operating frequencies, in addition to using a lower operating voltage. The pass transistors N0/N5 520 and N1/N4 530 may be sized/optimized for writeability only (as opposed to both writeability and readability) and thus be able to operate at a lower voltage than transistors which are sized based on readability. Additionally, the use of pairs of pass transistors (e.g., the transistor N0 520 paired with the transistor N1 530 and the transistor N5 520 paired with the transistor N4 530) may allow for lower operating voltages. Using pairs of pass transistors instead of a single pass transistor may eliminate the need for pre-charging the differential write bitlines 585/587 by allowing maskability without the pre-charge. Such pre-charging requires the differential write bitlines 585/587 to be driven twice per memory cycle for write operations. A pre-charging configuration also requires an initial charge when data does not change. Using pairs of pass transistors may allow for a line to be driven once during writes or to maintain a value already driven onto the line. An additional advantage of the embodiments described herein is that simultaneous reads and writes are possible as a benefit of not needing to pre-charge the circuit.

The relative positioning of the pass transistors (e.g., the transistor N0 520 with the transistor N1 530 and the transistor N5 520 with the transistor N4 530) may allow the 10T bitcell 500 to have less electrical load exposed to the differential write bitlines 585/587 by positioning the pass transistors N1/N4 530 on the inside of the circuit (as shown in FIG. 5).

Figure 6:
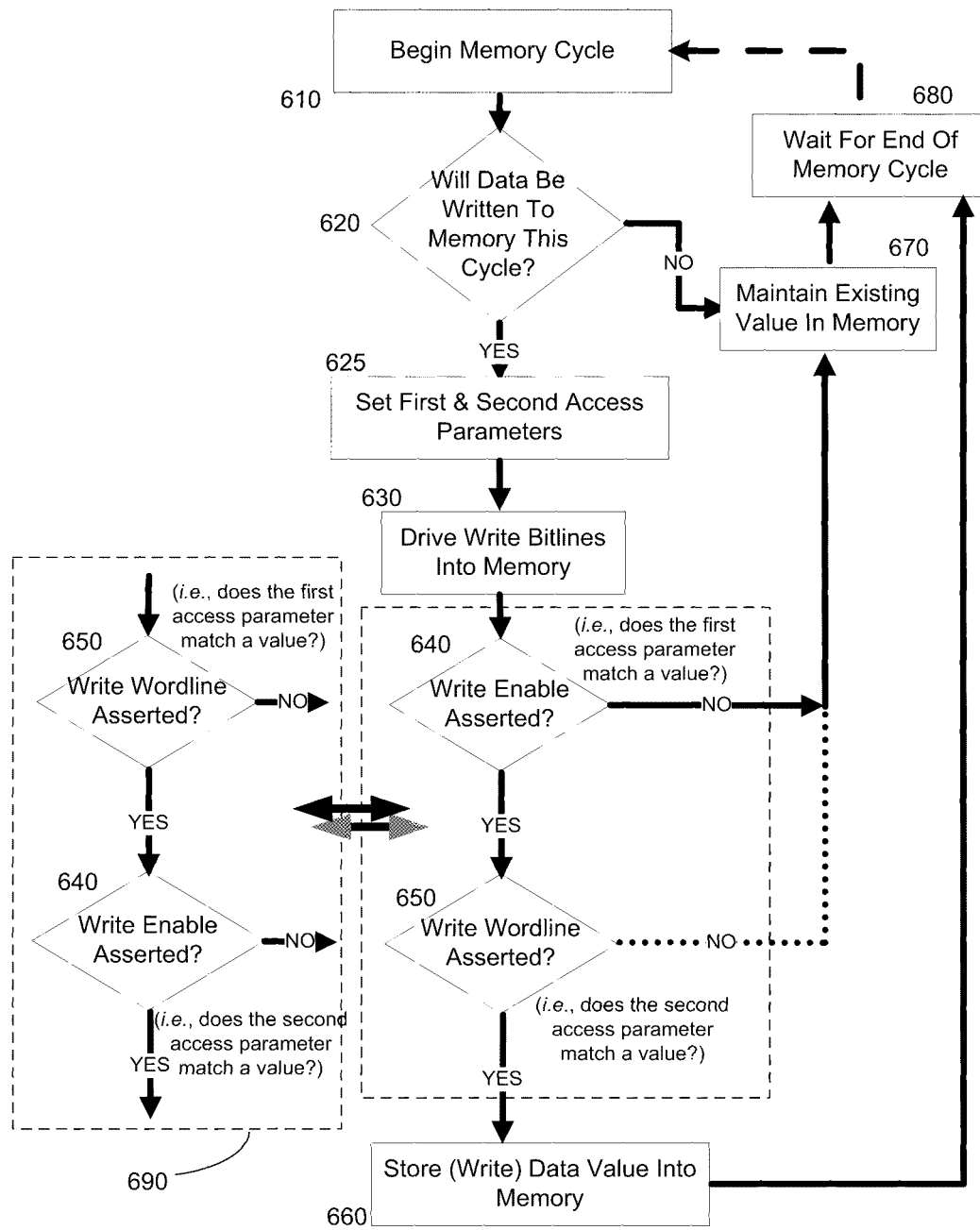
FIG. 6 illustrates a data write operation flowchart according to one embodiment of the present invention.

Turning now to FIG. 6, in accordance with one or more embodiments of the present invention, a flowchart depicting a memory write to the 10T bitcell 500 is shown. At step 610, the memory cycle begins. At step 620, it is determined if data will be written into the memory during the current memory cycle. If it is determined that data will be written to memory, first and second access parameters are set at step 625, then the process continues to step 630 where data is driven into the memory. If it is determined that no data will be written to memory, the process proceeds to step 670, the existing data value in memory is maintained, and the end of cycle is awaited at step 680. It is contemplated that while performing a memory write in one or more embodiments, the determination at step 620 of writing data into memory may refer to a determination of whether data will be written into an embedded memory 130, an array bank 410, a 10T bitcell array 420, and/or any number of 10T bitcell(s) 500. At step 630, control logic (not shown) drives the differential write bitlines 585, 587 into the memory.

At step 640, it is determined whether or not the write enable 580 (as shown, for example, in FIG. 5) is asserted. If it is determined that write enable 580 is asserted, the process continues to step 650; if it is determined that write enable 580 is not asserted, the process proceeds to step 670, the existing data value in memory is maintained, and the end of cycle is awaited at step 680. At step 650, it is determined whether or not the write wordline 575 (as shown, for example, in FIG. 5) is asserted. If it is determined that write wordline 575 is asserted, the process continues to step 660; if it is determined that write wordline 575 is not asserted, the process proceeds to step 670, the existing data value in memory is maintained, and the end of cycle is awaited at step 680. It should be noted that the order of steps 640 and 650 may be switched in one or more embodiments of the present invention, as shown in exemplary alternate flow 690. That is, after step 630, the flow may proceed first to step 650 and then to step 640. At step 660, after determinations at steps 640 and 650 that write enable 580 and write wordline 575 are asserted, data driven by the differential write bitlines 585, 587 is captured by the memory (e.g., a 10T bitcell 500, as shown in FIG. 5). At step 680, the flow waits for the end of the memory cycle. In one or more embodiments, when the end of a memory cycle is reached, a new memory cycle may begin (e.g., step 610).

Figures 7, 9B:
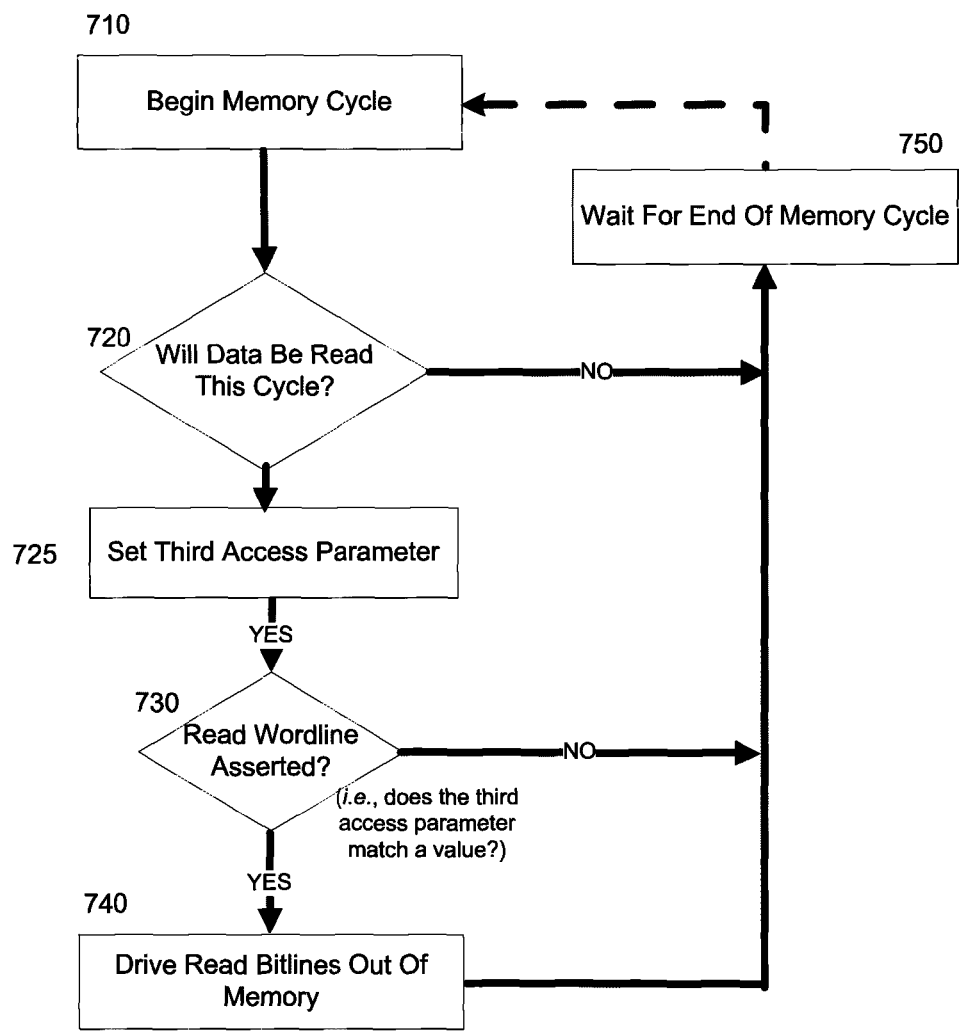
FIG. 7 illustrates a data read operation flowchart according to one embodiment of the present invention.

Turning now to FIG. 7, in accordance with one or more embodiments of the present invention, a flowchart depicting a memory read operation from a 10T bitcell 500 is shown. At step 710, the memory cycle begins. At step 720, it is determined if data is desired to be read from the memory during the current memory cycle. If it is determined that the data read operation from the 10T bitcell 500 is desired, a third access parameter is set, and the process continues to step 730; if it is determined that no data needs to be read from the 10T bitcell 500, the process proceeds to step 750 where the end of cycle is awaited. A person of skill in the art will appreciate that while performing a read from one of the 10T bitcells 500 in accordance with one or more embodiments, the determination at step 720 of reading data from the 10T bitcell 500 may refer to a determination of whether data will be read from an embedded memory 130, an array bank 410, a 10T bitcell array 420, and/or any number of the 10T bitcell(s) 500. At step 730, it is determined whether or not the read wordline 595 (as shown, for example, in FIG. 5) is asserted. If it is determined that the read wordline 595 is asserted, the process continues to step 740; if it is determined that the read wordline 595 is not asserted, the process proceeds to step 750 where the end of cycle is awaited. At step 740, the data in the 10T bitcell 500 (as illustrated, for example, in FIG. 5) is driven from the 10T bitcell 500 onto the read bitline 590 from which the data may be read. At step 750, the flow waits for the end of the memory cycle. In one or more embodiments, when the end of a memory cycle is reached, a new memory cycle may begin (e.g., step 710).

Turning back again to FIG. 5, an exemplary configuration for a 10T bitcell 500 for providing a functional low-voltage, maskable memory is shown. A person of skill in the art having the benefit of this disclosure will appreciate that a maskable memory may allow some bits to remain unwritten to and/or unread from during memory cycles in which other bits are written to and/or read from. For example, consider an exemplary 10T bitcell array 420, as depicted in FIG. 4, containing a single row of thirty-two of the 10T bitcells 500. Such a configuration may be said to store a "word" of data (i.e., 32 bits of data) as each of the 10T bitcell 500 may store one bit of data. In one embodiment, a memory cycle may be initiated during which a memory controller (not shown) and/or associated control logic 430/440 determines that some amount of data should be written to the 10T bitcell array 420 (alternatively described above with respect to FIG. 6). As previously described, the 10T bitcell array 420 may have associated control lines, data lines, electrical signals and/or data signals in various embodiments such as write enable(s) 580, write wordline(s) 575, differential write bitlines 585/587 to drive data to the 10T bitcell 500, and the like. If the memory controller (not shown) and/or associated control logic 430/440 determines that a particular bit stored in one of the thirty-two 10T bitcells 500 should not be written to (i.e., the stored bit should remain unchanged during a write operation), the 10T bitcell 500 containing that bit may be masked. Put another way masking may prevent data from being written to a 10T bitcell 500. To accomplish a masking operation in accordance with an exemplary embodiment, the memory controller and/or associated control logic 430/440 may determine that the write enable 580 associated with a particular 10T bitcell 500 will not be asserted. By not asserting the associated write enable 580, the pass transistor N0 and the pass transistor N5 520 may not be activated, thus no path will exist to the differential write bitlines 585/587 from which the 10T bitcell 500 may capture the value driven into memory even though the pass transistor N1 and the pass transistor N4 may be activated. As a result, a data write operation to the 10T bitcell array 420 may write data into any of the 10T bitcells therein which are not masked, but may not write data into the 10T bitcells which are masked.

In one embodiment, a method may be used for setting a first access parameter, for example the write enable 580, the first access parameter being associated with a memory cell, for example the 10T bitcell 500, in a storage device (e.g., an embedded RAM 130 and/or an array bank 410), and for setting a second access parameter, for example the write wordline 575, the second access parameter also being associated with the memory cell in the storage device. The method may also store a data value in the memory cell in the storage device if the first access parameter matches a first pre-determined value and if the second access parameter matches a second pre-determined value, for example if the access parameters each have a logical value of '1' and can activate the gates of pass transistors N0, N5 520 and N1, N4 530. The method may also maintain a data value in the memory cell in the storage device if the first access parameter differs from the first pre-determined value, for example if the first access parameter has a logical value of '0' and cannot activate the gates of pass transistors N0, N5 520).

In one embodiment, a memory cell (e.g., 10T bitcell 500), storage device (e.g., embedded RAM 130) or other memory structure (e.g., array bank 410) may include a first pair of access parameter ports (e.g., pass transistors N0 and N5 520) associated with a first access parameter (e.g., write enable 580), and a second pair of access parameter ports (e.g., pass transistors N1 and N4 520) associated with a second access parameter (e.g., write wordline 575). The memory cell or storage device may also include a data storage structure (e.g., transistors P0 and P1 540, N2 and N3 550) coupled to the first pair of access parameter ports and to the second pair of access parameter ports. The data storage structure may be adapted to store a data value if the first access parameter is provided on the first pair of access parameter ports, where the first access parameter matches a first pre-determined value (e.g., if a logical '1' is provided to the gates of pass transistors N0 and N5 520), and if a second access parameter is provided on the second pair of access parameter ports, where the second access parameter matches a second pre-determined value (e.g., if a logical '1' is provided to the gates of pass transistors N1 and N4 530). The storage structure may be further adapted to maintain a stored value if the first access parameter provided on the first pair of access parameter ports differs from the first pre-determined value (e.g., the first access parameter has a logical value of '0' and cannot activate the gates of pass transistors N0, N5 520).

In one embodiment, a system may include at least one control logic block (e.g., groups/blocks of control logic 430/440). The at least one control logic block may adapted to set one or more first access parameters (e.g., write enable 580) and adapted to set one or more second access parameters (e.g., write wordline 575). The system may also include a plurality of data storage devices (e.g., array bank(s) 410) operatively coupled to the control logic block(s). The plurality of data storage devices are capable of receiving the first access parameter(s) and the second access parameter(s) from the control logic block(s). Within the system, the each storage devices may comprise a first pair of storage components (e.g., transistors P0 and P1 540) adapted to provide a pull-up function to store a first logical data value (e.g., '1') in the storage device and a second pair of storage components (e.g., transistors N2 and N3 550) coupled to the first pair of storage components, where the second pair of storage components are adapted to provide a pull-down function to store a second logical data value (e.g., '0') in the storage device. The first and second pairs of storage components are further adapted to maintain a value in the data storage structure. Each of the storage devices in the system may also include a pair of first access ports (e.g., pass transistors N0 and N5 520) and a pair of second access ports (e.g., pass transistors N1 and N4 530) coupled to the first and second pair of storage components. The first and second pair of access ports may be adapted to allow the storage device to store a data value if a first access parameter (e.g., write enable 580) and a second access parameter (e.g., write wordline 575) each match a predetermined value (e.g., a logical '1'). The first and second access ports are further adapted to prevent storage of a data value if the first access parameter differs from a first predetermined value (e.g., write enable 580 is a logical '0').

Turning now to FIGS. 8A-8D, an illustrative example of masking is shown. FIG. 8A depicts a 32-bit data word called "Data Word 'A'" 810 having a value of '1' for the sixteen most significant bits (bits [31:16]) and a value of '0' for the sixteen least significant bits (bits [15:0]). In one embodiment, in accordance with FIG. 4, the 10T bitcell array 420 may contain thirty-two of the 10T bitcells 500, where each bitcell 500 may be adapted to store one of the thirty-two bits of Data Word 'A' 810. In the context of this masking example, Data Word 'A' 810 is currently stored in a 10T bitcell array 420.

FIG. 8B depicts a data mask called "Data Mask 'A'" 820. Data Mask 'A' 820, in accordance with one embodiment, may have a value of '0' for bits [31] and [0] as shown. A value of '0' in a mask, in accordance with one embodiment, may indicate that this bit will be masked, or not written to during a write operation, while a value of '1' indicates that the corresponding bit will not be masked (i.e., will be written to). It should be noted that using a value of '0' to denote masked bits is a design choice, and that the mask may alternatively use values of '1' or 'x' instead of '0', as may be understood by a person of skill in the art. As shown in FIG. 8B, Data Mask 'A' 820 may provide a way to mask bits [31] and [0] in a thirty-two bit 10T bitcell array 420; put another way, the values stored in the thirty-second 10T bitcell 500 of the 10T bitcell array 420 and the first 10T bitcell 500 of the 10T bitcell array 420 will not be changed upon writing data to the 10T bitcell array 420 if the data is masked in this way. To implement the mask, in accordance with one or more embodiments, the 32-bit value of the Data Mask 'A' 820 is applied to the thirty-two write enable 580 lines respectively (as shown in FIGS. 4 & 5, and as described above). That is, each column (i.e., each of the 10T bitcells 500) in the 10T bitcell array 420 has a corresponding write enable 580 which will be asserted (not masked—mask value of '1') or not asserted (masked—mask value of '0') during a data write operation.

FIG. 8C depicts a 32-bit data word called "Data Word 'B'" 830 having a value of '0' for the sixteen most significant bits (bits [31:16]) and a value of '1' for the sixteen least significant bits (bits [15:0]). Data Word 'B', in the context of this example, will be written to the 10T bitcell array 420 which is currently storing the value Data Word 'A' 810 in this illustrated embodiment, but the data written to the array 420 will be masked using Data Mask 'A' 820.

FIG. 8D depicts the resulting 32-bit data word ("Data Word 'C'" 840) which may be, in one embodiment, stored in the 10T bitcell array 420 upon completion of the masked data write operation. If bits [31] and [0] were masked using Data Mask 'A' 820, the corresponding bit(s) in Data Word 'A' 810 would not be written to and would remain unchanged. Thus, even though Data Word 'B' 830 was written with a value of '0' for bits [31:16], the resulting Data Word 'C' 840 has a value of '1' for bit [31] because of the particular masking used in this illustrative embodiment. Similarly, even though Data Word 'B' 830 was written with a value of '1' for bits [15:0], the resulting Data Word 'C' 840 has a value of '0' for bit [0] because of the particular masking used in this embodiment.

It should be noted that similar masking approaches may be applied to entire array banks 410 or to any number of the 10T bitcells 500 without deviating from the spirit and scope of the embodiments of the instant invention.

It is also contemplated that, in some embodiments, different kinds of hardware descriptive languages (HDL) may be used in the process of designing and manufacturing very large scale integration circuits (VLSI circuits) such as semiconductor products and devices and/or other types semiconductor devices. Some examples of HDL are VHDL and Verilog/Verilog-XL, but other HDL formats not listed may be used. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units 160, RAMs 130 & 155, compact discs, DVDs, solid state storage and the like). In one embodiment, the GDSII data (or other similar data) may be adapted to configure a manufacturing facility (e.g., through the use of mask works) to create devices capable of embodying various aspects of the instant invention. In other words, in various embodiments, this GDSII data (or other similar data) may be programmed into a computer 100, processor 125/140 or controller, which may then control, in whole or part, the operation of a semiconductor manufacturing facility (or fab) to create semiconductor products and devices. For example, in one embodiment, silicon wafers containing 10T bitcells 500, 10T bitcell arrays 420 and/or array banks 410 may be created using the GDSII data (or other similar data).

It should also be noted that while various embodiments may be described in terms of memory storage for graphics processing, it is contemplated that the embodiments described herein may have a wide range of applicability, not just for graphics processes, as would be apparent to one of skill in the art having the benefit of this disclosure.

The particular embodiments disclosed above are illustrative only, as the invention may be modified and practiced in different but equivalent manners apparent to those skilled in the art having the benefit of the teachings herein. Furthermore, no limitations are intended to the details of construction or design as shown herein, other than as described in the claims below. It is therefore evident that the particular embodiments disclosed above may be altered or modified and all such variations are considered within the scope and spirit of the claimed invention.

Accordingly, the protection sought herein is as set forth in the claims below.

What is claimed is:

1. A method comprising:
    storing a data value in a memory cell in a storage device if a first access parameter associated with the memory cell matches a first pre-determined value and if a second access parameter associated with the memory cell matches a second pre-determined value, wherein storing the data further comprise writing the data to the memory cell in the storage device using differential signal lines; and
    maintaining a data value in the memory cell in the storage device if the first access parameter differs from the first pre-determined value.

2. The method of claim 1, further comprising:
    reading data from the memory cell in the storage device if a third access parameter associated with the memory cell matches a third pre-determined value.

3. The method of claim 2, further comprising:
    setting the first access parameter associated with the memory cell in the storage device;
    setting the second access parameter associated with the memory cell in the storage device; and
    setting the third access parameter associated with the memory cell in the storage device.

4. The method of claim 3, wherein reading the data from the memory cell further comprises reading the data from the memory cell simultaneously with storing the data value in the memory cell.

5. The method of claim 3, wherein the third access parameter is a read wordline parameter.

6. The method of claim 3, wherein the first access parameter is a write enable parameter, and the second access parameter is a write wordline parameter.

7. The method of claim 3, further comprising:
    setting at least a first plurality of access parameters associated with a corresponding memory cell in a storage device;
    setting at least a second plurality of access parameters associated with a corresponding memory cell in a storage device;
    storing a plurality of data values in a corresponding plurality of memory cells in the storage device if each first access parameter of each memory cell matches a corresponding first pre-determined value and each second access parameter of each memory cell matches a corresponding second pre-determined value; and
    maintaining a data value in each memory cell in the storage device where the first access parameter differs from the corresponding first pre-determined value.

8. An apparatus, comprising:
    a first pair of access parameter ports associated with a first access parameter;
    a second pair of access parameter ports associated with a second access parameter and
        operatively coupled to the first pair of access parameter ports; and
        wherein the first pair of access parameter ports and the second pair of access parameter ports are adapted to allow access through the access parameter port pairs if the first access parameter matches a first pre-determined value and if the second access parameter matches a second pre-determined value;
    a data storage structure coupled to the first pair of access parameter ports and to the second pair of access parameter ports, wherein the data storage structure is adapted to store a data value if the first access parameter is provided on the pair of access parameter ports, and if the second access parameters is provided on the second pair of access parameter ports;
        wherein the storage structure is further adapted to maintain a stored value if the first access parameter provided on the first pair of access parameter ports differs from the first pre-determined value; and
        wherein the first pair access parameter ports is adapted to be coupled to the data storage structure through the second pair of access parameter ports, and
    wherein the data storage structure further comprises:
    a first pair of storage adapted to provide a pull-up function to store a first logical data value in the storage device; and
        a second pair of storage components coupled to the first pair of storage components, the second pair of storage components adapted to provide a pull-down function to store a second logical data in the storage device, wherein the first and second pairs of storage components are adapted to store a value in the data storage structure, and further wherein the first and second pairs of storage components are adapted to maintain a value in the data storage structure.

9. The apparatus of claim 8, further comprising:
    a third pair of storage components adapted to be coupled to the first pair of storage components and to the second pair of storage components, wherein the third pair of storage components are further adapted to provide access to the stored value in the data storage structure.

10. The apparatus of claim 9, wherein each component of the first, second and third pairs of storage components comprises a transistor.

11. The apparatus of claim 10, wherein each component of the second and third pairs of storage components comprises an n-channel transistor, and further wherein each component of the first pair of storage components comprises a p-channel transistor.

12. The apparatus of claim 9, wherein each component of the second and third pairs of storage components comprises a transistor, and further wherein each component of the first pair of storage components comprises a resistor.

13. The apparatus of claim 8, wherein the first pair of access parameter ports and the second pair of access parameter ports each comprise a pair of transistors, the pairs of transistors each being sized for writeability.

14. A system, comprising:
at least one control logic block, wherein the at least one control logic block is adapted to set one or more first access parameters and adapted to set one or more second access parameters;
a plurality of data storage devices operatively coupled to the at least one control logic block, wherein the plurality of data storage devices are capable of receiving the one or more first access parameters and the one or more second access parameters from the at least one control logic block, and wherein the plurality of storage devices each comprises:
a first pair of storage components adapted to provide a pull-up function to store a first logical data value in the storage device;
a second pair of storage components coupled to the first pair of storage components, the second pair of storage components adapted to provide a pull-down function to store a second logical data value in the storage device, wherein the first and second pairs of storage components are further adapted to maintain a value in the data storage structure; and
a pair of first access ports and a pair of second access ports coupled to the first and second pair of storage components, the first and second access ports adapted to allow the storage device to store a data value if a first access parameter and a second access parameter each match a predetermined value, the first and second pair of access ports being further adapted to prevent storage of a data value if the first access parameter differs from a first predetermined value.

15. The system of claim 14, wherein the plurality of storage devices are arranged into one or more storage arrays, the one or more storage arrays comprising at least one row and at least one column of storage devices.

16. The system of claim 15, wherein one array of the one or more storage arrays is selected for operation using a multiplexor.

17. The system of claim 15, wherein the control logic block is further adapted to provide the one or more first access parameters for each respective storage device in a column of an array of the one or more storage arrays and is adapted to provide the one or more second access parameters for each respective storage device in a row of the one array of the one or more storage arrays.

18. The system of claim 14, wherein the at least one control block is further adapted to set one or more third access parameters associated with the plurality of data storage devices and adapted to provide the one or more third access parameters for each respective storage device in a row of the one array of the one or more storage arrays.

19. A computer chip, comprising:
a plurality of data storage devices;
at least one control block operatively coupled to the plurality of data storage devices, the at least one control block being adapted to control the plurality of data storage devices; and
wherein one or more first access parameters and one or more second access parameters are provided to the plurality of data storage devices by the control block; and
wherein each of the plurality of data storage devices comprises:
a first pair of access parameter ports associated with a respective first access parameter;
a second pair of access parameter ports associated with a respective second access parameter; and
a data storage structure coupled to the first pair of access parameter ports and to the second pair of access parameter ports, wherein the data storage structure is adapted to store a data value if the respective first access parameter is provided on the first pair of access parameter ports, and if a respective second access parameter is provided on the second pair of access parameter ports;
wherein the respective first access parameter matches a first pre-determined value, and wherein the respective second access parameter matches a second pre-determined value; and
wherein the data storage structure is further adapted to maintain a stored value if the respective first access parameter provided on the first pair of access parameter ports differs from the first pre-determined value.

20. The computer chip of claim 19, wherein the at least one control block is adapted to set one or more first access parameters associated with the plurality of data storage devices and adapted to set one or more second access parameters associated with the plurality of data storage devices.

21. The computer chip of claim 19, further comprising:
one or more storage arrays comprising at least a portion of the plurality of storage devices, wherein the one or more storage arrays each comprises at least one row and at least one column; and
wherein the at least one control block is further adapted to set and to provide one or more third access parameters to the plurality of storage devices in the at least one row of the one or more storage arrays.

22. The computer chip of claim 21, wherein the at least one control block is further adapted to provide data stored in the at least one row of the one or more storage arrays to a graphics processing unit if the one or more third access parameters matches a third pre-determined value.

23. The computer chip of claim 22, further wherein the graphics processing unit is capable of being operatively coupled to the at least one control block.

24. The computer chip of claim 23, further comprising:
at least one of a northbridge circuit and a central processing unit operatively coupled to at least one of the graphics processing unit and the at least one control block.

25. The computer chip of claim 23, further comprising:
a plurality of packaging connectors operatively coupled to at least one of the graphics processing unit and the at least one control block; and
a chip packaging unit operatively coupled to the plurality of packaging connectors, the chip packaging unit comprising:
a chip housing; and
a plurality of circuit board connector pins.

26. The circuit board of claim 25, further comprising:
a first silicon-based computer chip, wherein the random access memory and the graphics processing unit reside on the first silicon-based computer chip.

27. The circuit board of claim 26, further comprising at least one of a central processing unit and a northbridge circuit, wherein the at least one of a central processing unit and northbridge circuit reside on at least one of the first silicon-based computer chip and a second silicon-based computer chip.

28. A circuit board, comprising:
a graphics processing unit; and
a random access memory operatively coupled to the graphics processing unit, wherein the random access memory comprises:
control logic circuitry;
a plurality of storage units;
a plurality of storage arrays operatively coupled to the control logic circuitry, the plurality of storage arrays comprising the plurality of storage units; and
wherein each of the plurality of storage units comprises:
a first pair of access parameter ports associated with a first access parameter;
a second pair of access parameter ports associated with a second access parameter; and
a data storage structure coupled to the first pair of access parameter ports and to the second pair of access parameter ports, wherein the data storage structure is adapted to store a data value if the first access parameter is provided on the first pair of access parameter ports, and if a second access parameter is provided on the second pair of access parameter ports;
wherein the first access parameter matches a first pre-determined value and the second access parameter matches a second pre-determined value; and
wherein the storage structure is further adapted to maintain a stored value if the first access parameter provided on the first pair of access parameter ports differs from the first pre-determined value.

29. The circuit board of claim 28, wherein each of the plurality of storage units further comprises:
a read access parameter port associated with a third access parameter, wherein the data storage structure is adapted to provide the stored value if the third access parameter is provided on the read access parameter port, wherein the third access parameter matches a third pre-determined value.

30. The circuit board of claim 28, wherein the random access memory is an embedded, static random access memory.

31. A computer, comprising:
a printed circuit board comprising a bus;
a central processing unit operatively coupled to the bus;
a graphics processor operatively coupled to the bus; and
a first memory device operatively coupled to the graphics processor, the first memory device comprising:
a first pair of access parameter ports associated with a first access parameter;
a second pair of access parameter ports associated with a second access parameter; and
a data storage structure coupled to the first pair of access parameter ports and to the second pair of access parameter ports, wherein the data storage structure is adapted to store a data value if the first access parameter is provided on the first pair of access parameter ports, and if the second access parameter is provided on the second pair of access parameter ports;
wherein the first access parameter matches a first pre-determined value, and wherein the second access parameter matches a second pre-determined value; and
wherein the data storage structure is further adapted to maintain a stored value if the first access parameter provided on the first pair of access parameter ports differs from the first pre-determined value.

32. The computer of claim 31, wherein the first memory device further comprises:
a read access parameter port associated with a third access parameter; and
wherein the first memory device is adapted to provide access to the stored value in the data storage structure if the third access parameter is provided on the read access parameter port, wherein the third access parameter matches a third pre-determined value.

33. The computer of claim 32, wherein the first memory device is an embedded, random access memory device.

34. The computer of claim 32, further comprising:
a data storage unit;
at least one input device;
at least one peripheral device; and
a second memory device comprising a dynamic random access memory.

35. The computer of claim 31, wherein the printed circuit board further comprises:
the graphics processor; and
the central processing unit.

36. A computer readable storage device encoded with data that, when implemented in a manufacturing facility, adapts the manufacturing facility to create an apparatus, comprising:
a first pair of access parameter ports associated with a first access parameter;
a second pair of access parameter ports associated with a second access parameter and operatively coupled to the first pair of access parameter ports; and
wherein the first pair of access parameter ports and the second pair of access parameter ports are adapted to allow access through the access parameter port pairs if the first access parameter matches a first pre-determined value and if the second access parameter matches a second pre-determined value;
a data storage structure coupled to the first pair of access parameter ports and to the second pair of access parameter ports, wherein the data storage structure is adapted to store a data value if the first access parameter is provided on the first pair of access parameter ports, and if the second access parameter is provided on the second pair of access parameter ports; and
wherein the storage structure is further adapted to maintain a stored value if the first access parameter provided on the first pair of access parameter ports differs from the first pre-determined value; and
wherein the first access parameter ports is adapted to be coupled to the data storage structure through the second pair of access parameter ports;
a first pair of storage components adapted to provide a pull-up function to store a first logical data value in the storage device; and
a second pair of storage components coupled to the first pair of storage components, the second pair of storage components adapted to provide a pull-down function to store a second logical data value in the storage device, wherein the first and second pairs of storage components are adapted to store a value in the data storage structure, and further wherein the first and second pairs of storage components are adapted to maintain a value in the data storage structure.

37. A computer readable storage device, as set forth in claim 36, encoded with data that, when implemented in a manufacturing facility, adapts the manufacturing facility to create an apparatus further comprising:

a third pair of storage components adapted to be coupled to the first pair of storage components and to the second pair of storage components, wherein the third pair of storage components are further adapted to provide access to the stored value in the data storage structure.

38. A computer readable storage device, as set forth in claim 36, encoded with data that, when implemented in a manufacturing facility, adapts the manufacturing facility to create an apparatus, wherein the first pair of access parameter ports and the second pair of access parameter ports each comprise a pair of transistors, the pairs of transistors each being sized for writeability.

* * * * *

UNITED STATES PATENT AND TRADEMARK OFFICE
CERTIFICATE OF CORRECTION

PATENT NO. : 8,456,945 B2
APPLICATION NO. : 12/766403
DATED : June 4, 2013
INVENTOR(S) : Spencer Gold et al.

It is certified that error appears in the above-identified patent and that said Letters Patent is hereby corrected as shown below:

In the Claims

Column 17, Line 44, please change "wherein storing the data further comprise writing the data to the memory cell in the storage device using differential signal lines;" to -- wherein storing the data further comprises writing the data to the memory cell in the storage device using differential signal lines; --

Column 18, Line 50, please change "a first pair of storage adapted to provide a pull-up function to store a first logical data value in the storage device;" to -- a first pair of storage components adapted to provide a pull-up function to store a first logical data value in the storage device; --

Signed and Sealed this
Eleventh Day of March, 2014

Michelle K. Lee
*Deputy Director of the United States Patent and Trademark Office*